United States Patent
Lo et al.

(10) Patent No.: US 7,782,073 B2
(45) Date of Patent: Aug. 24, 2010

(54) HIGH ACCURACY AND UNIVERSAL ON-CHIP SWITCH MATRIX TESTLINE

(75) Inventors: Tseng Chin Lo, Hsinchu (TW); Kuo-Tsai Li, San Jose, CA (US); Shien-Yang Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 136 days.

(21) Appl. No.: 11/731,444

(22) Filed: Mar. 30, 2007

(65) Prior Publication Data
US 2008/0238453 A1 Oct. 2, 2008

(51) Int. Cl.
*G01R 31/26* (2006.01)

(52) U.S. Cl. ...................... 324/763; 324/765

(58) Field of Classification Search ............... None
See application file for complete search history.

(56) References Cited

U.S. PATENT DOCUMENTS

| | | | | |
|---|---|---|---|---|
| 5,051,690 A | * | 9/1991 | Maly et al. | 324/537 |
| 5,539,325 A | * | 7/1996 | Rostoker et al. | 324/763 |
| 6,528,818 B1 | * | 3/2003 | Satya et al. | 257/48 |
| 6,820,046 B1 | | 11/2004 | Lamson et al. | |
| 6,873,146 B2 | | 3/2005 | Liu | |
| 6,921,672 B2 | * | 7/2005 | Satya et al. | 324/537 |
| 7,126,359 B2 | * | 10/2006 | Huang et al. | 324/754 |
| 7,224,176 B2 | * | 5/2007 | Ryu et al. | 324/763 |
| 7,394,270 B2 | * | 7/2008 | Jimi | 324/758 |
| 7,475,000 B2 | | 1/2009 | Cook et al. | |
| 2002/0144212 A1 | | 10/2002 | Lev et al. | |
| 2003/0034489 A1 | * | 2/2003 | Bhattacharya et al. | 257/48 |
| 2004/0017217 A1 | | 1/2004 | Ryu et al. | |
| 2004/0178787 A1 | * | 9/2004 | Liu | 324/158.1 |
| 2006/0067143 A1 | * | 3/2006 | Kim | 365/201 |
| 2008/0073753 A1 | * | 3/2008 | Tsai et al. | 257/620 |
| 2008/0244475 A1 | * | 10/2008 | Lo et al. | 716/4 |
| 2008/0303539 A1 | * | 12/2008 | Chen et al. | 324/754 |

* cited by examiner

*Primary Examiner*—Jermele M Hollington
(74) *Attorney, Agent, or Firm*—Slater & Matsil, L.L.P.

(57) ABSTRACT

A testline structure made for integrated circuit tests is presented. The structure includes an array of testline pads formed in the scribe line area or integrated circuit die area on a semiconductor substrate, a plurality of test devices formed under the pads area, and a select circuit selectively connecting one of the test devices. The testline structure of this invention enables access to a large number of test devices through the same number of pads as on a conventional testline and can be employed to conduct parametric, reliability, and functional tests on the same. A source measurement unit (SMU) in a conventional integrated circuit tester is employed to sense and force predetermined test conditions on the test device terminals and conduct accurate Kelvin tests on the selected device. A method of using this testline structure is also presented.

18 Claims, 10 Drawing Sheets

HIGH ACCURACY AND UNIVERSAL ON-CHIP SWITCH MATRIX TESTLINE

CROSS-REFERENCE TO RELATED APPLICATIONS

This application relates to the following co-pending and commonly assigned U.S. patent application Ser. No. 11/731,036, filed Mar. 30, 2007, entitled "Network Based Integrated Circuit Testline Generator".

TECHNICAL FIELD

The present invention relates generally to the testing of integrated circuits, and more particularly to the making and using of a high accuracy and universal switch matrix testline on integrated circuit wafer substrate for wafer acceptance testing (WAT) and other R&D testing needs.

BACKGROUND

In integrated circuit (IC) manufacturing, a semiconductor wafer typically contains a plurality of testlines in the scribe line area between adjacent wafer dies. Each testline includes a number of test devices, which are devices similar to those that are normally used to form the integrated circuit products in the wafer die area. By studying the parametric test results of devices on these testlines, it is possible to monitor, improve, and refine a semiconductor manufacturing process.

With the continuing scale-down of IC device feature sizes, integrated circuit device density and functional complexity are continuously increasing. This trend imposes new challenges on the existing parametric testline structure and test methodologies. One of these challenges is that the testlines of advanced technology devices must include a tremendous amount of test structures to meet the testing needs for advanced semiconductor devices and complex integrated circuits. However, the current testline structure can only support a limited number of test devices, as known to people skilled in the art.

Another challenge is that the parametric test results on existing testline devices are gradually losing their correlation with real integrated circuit performance, as technology advances. This is due to the fact that typical structures in semiconductor manufacturing only supply generic testline devices corresponding to a specific technology node, while the circuit designers/customers might integrate customized devices/circuits (for example, proprietary IPs) in their products for achieving specific circuit functions. In current practice, these customized devices are not presented and tested on a conventional testline due to the limited available spaces for test devices.

Another challenge is the need to design-for-manufacturability (DFM) in advanced technology. In current practice, library and test structure designers focus more on electrical characteristics than on layout styles due to their lack of visibility on the impact of layout styles on device manufacturing yield. In order to analyze the correlation of a specific layout style to a process yield and obtain a preferred set of library/test structure layouts leading to predictable manufacturing yield on an advanced technology generation, designers need much more testing resources on a testline than they are currently offered by a conventional testline.

Another limitation of conventional testlines can be appreciated by those skilled in the semiconductor R&D field. In semiconductor manufacturing, the mass production of an integrated circuit product normally follows a long period of pilot line development stage, during which extensive design-on-experiment (DOE) and statistical split activities are carried out to obtain the optimal process parameters and reach a process flow for high manufacturing yield. Conducting DOE and statistical split involves forming a large number of the test devices under different process conditions and obtaining the optimized process parameters by statistical analysis on the test results. Due to the limitation of available test device spaces on a conventional testline, a large quantity of test wafers are required in order to obtain reliable statistical results. Tuning a process flow in advanced technology demands more DOE and statistical split activities, which will have a significant impact on the cost of R&D.

In view of these and other issues in a conventional parametric testline and the ever increasing testing tasks demanded by advanced technologies, there is a need for improved testline structures capable of accessing a large number of test devices and conducting highly accurate parametric tests and methods of using the same.

SUMMARY OF THE INVENTION

These and other problems are generally solved or circumvented, and technical advantages are generally achieved, by preferred embodiments of the present invention which involve forming a multiplexing circuit in a testline (MUX testline) to facilitate the access to a large number of test devices formed in the same semiconductor substrate area under a conventional testline.

In accordance with a preferred embodiment of the present invention, an integrated circuit testline structure on a substrate comprises a support substrate having a working top surface, a plurality of test devices formed on said substrate, and a plurality of testline pads. Said testline pads further comprise a first address pad to provide a first address code to a selection circuit, a second address pad to provide a second address code to said selection circuit, a first forcing pad to provide a first stimulus to a device terminal of at least one of said test devices, and a first sensing pad to sense a first response from a device terminal of at least one of said test devices. Said selection circuit is configured to read said first and second address code, and selectively connect a first terminal of one of said test devices to said first sensing and said first forcing pads in response to said first and second address code.

In accordance with another preferred embodiment of the present invention, a semiconductor device testline structure comprises a support substrate, a plurality of test devices formed in said substrate, and a plurality of testline pads formed on the surface of said substrate. Said testline pads include a first address pad to provide a first address code to a selection circuit, a second address pad to provide a second address code to said selection circuit, a first forcing pad to provide a first stimulus to a device terminal of at least one of said test devices, a first sensing pad to sense a first response from a device terminal of at least one of said test devices, a second forcing pad to provide a second stimulus to a device terminal of at least one of said test devices, and a second sensing pad to sense a second response from a device terminal of at least one of said test devices. Said selection circuit is configured to read said first and second address code, and selectively connect a first terminal of one of the test devices to said first sensing and said first forcing pads and connect a second terminal of one of said test devices to said second sensing and said second forcing pads in response to said first and second address code.

In accordance with yet another preferred embodiment of the present invention, a method of testing an integrated circuit comprises applying a first address code to a first address pad, applying a second address code to a second address pad, in response to applying the first and second address codes to the first and second address pads, respectively, selectively coupling at least one test device, from among a plurality of test devices, to a first sensing pad and a first forcing pad, applying a stimulus to at least one said test device via said first forcing pad, and detecting a response of at least one said test device via said first sensing pad.

Advantageous features provided by preferred embodiments of the present invention include, but not limited to, improvement on testline space utilization and increased flexibility in circuit design.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a high accuracy and universal device-under-test (DUT) on-chip switch matrix testline (MUX testline) for wafer acceptance testing (WAT). The preferred embodiments of the invention include the MUX testline structure and testing methodology using the testline structure. The invention may also be applied, however, to benefit other R&D activities, such as yield analysis, design-of-experiment (DOE), statistical split, and customized user test key input, among others.

Figure 1A:
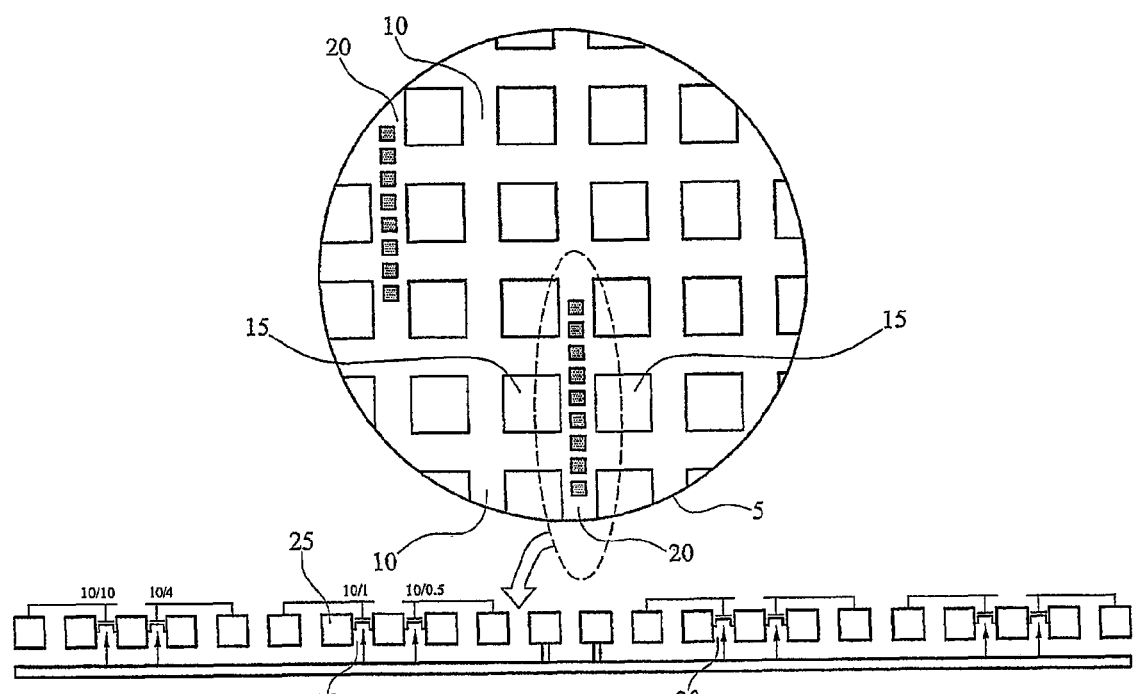
FIG. 1A is a plan view of a conventional parametric testline formed on a semiconductor wafer substrate.

Referring now to the drawings and first to FIG. 1A, which illustrates a plan view of a conventional parametric testline 20 formed on a semiconductor wafer substrate 5. As familiar to those skilled in the art, a parametric test line is formed in a scribe line area 10 between adjacent wafer dies 15. Each testline is made up by a serial number of aligned test pads. Each test pad 25 has a square shape and may be made from metal or other electrically conductive materials. Test pads on a testline are electrically connected to a plurality of device-under-test (DUTs) 30 formed beneath the test pad layer. Pluralities of test lines with different DUTs are formed in scribe line areas across the substrate. The DUTs are test device structures designed to measure device parameters, such as MOSFET Vt, contact/via chain resistance, gate oxide breakdown voltage, and the like. By studying these parameters, it is possible to monitor, improve and refine a semiconductor production process.

Figure 1B:
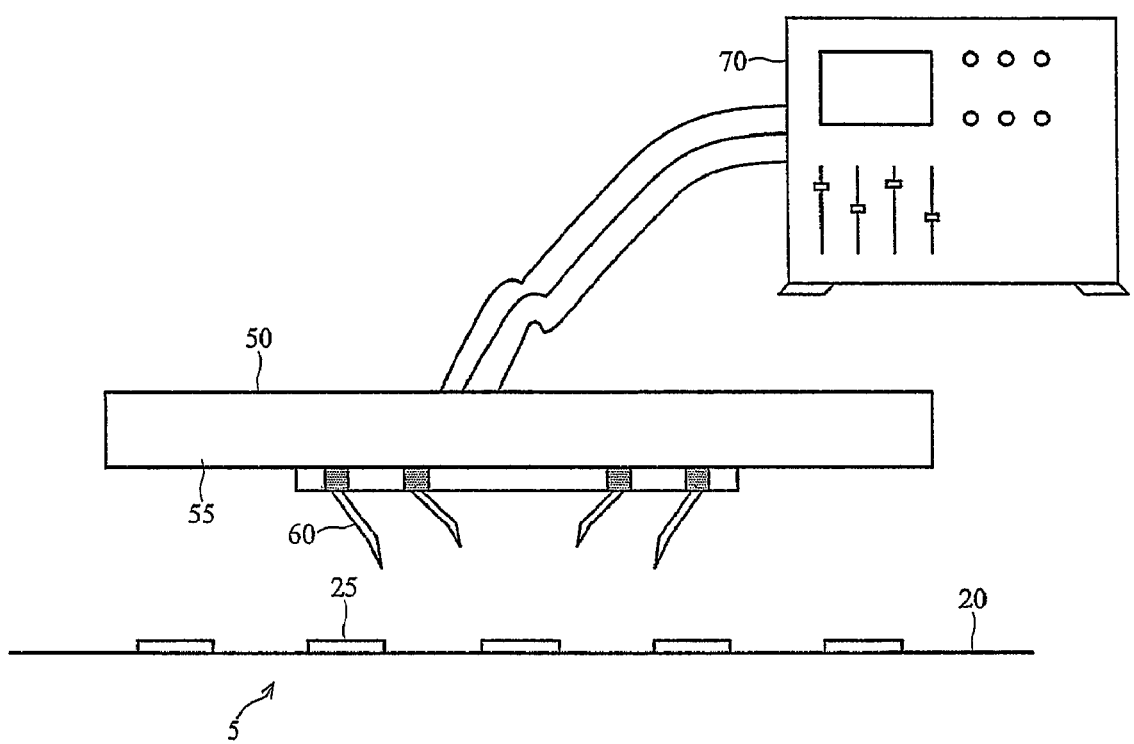
FIG. 1B shows a probe card configuration used in conventional parametric test.

FIG. 1B shows a probe card 50 used in a conventional parametric test. A probe card comprises a probe substrate 55 such as a circuit board, and a plurality of probe pins 60 extending from a bottom surface of the probe substrate. The probe card sequentially and repeatedly applies electrical test signals to and receives responses from the test pads on a parametric test line through the probe pins and the probe substrate. A probe card is usually connected to a testing apparatus (tester) 70 where test stimuli (programs) are installed and test results may be recorded. Upon finishing parametric tests, failed dies are inked. The wafer is then diced along the scribe lines and thus many small dies are created. Finally, failed dies are scrapped or downgraded and passed dies are packaged.

Figure 2:
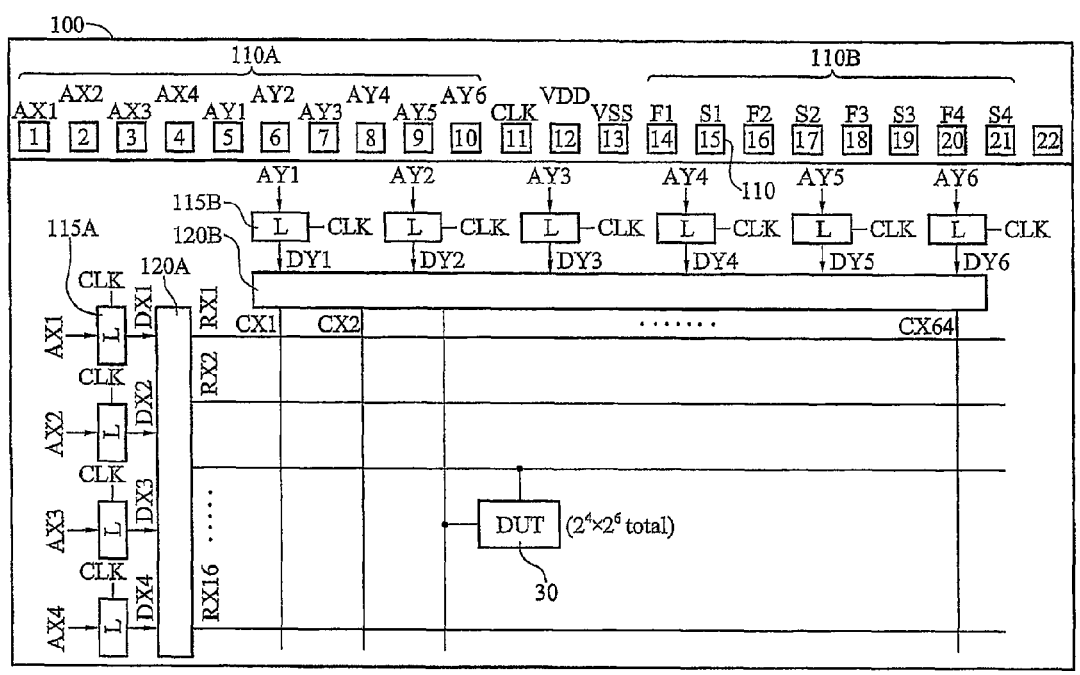
FIG. 2 is a schematic plan view of a MUX testline.

FIG. 2 is a schematic plan view illustrating the testline arrangement on a semiconductor wafer in accordance with an embodiment of the present invention. A testline 100 is formed in a scribe line area (not shown) of a semiconductor wafer and comprises a plurality of aligned test pads 110. In one preferred embodiment, a testline comprises 22 test pads made of standard 2.5V I/O devices, familiar to those skilled in the art, although testlines comprising other pad types and pad numbers are not excluded. Unlike test pads connecting directly to DUTs formed under the test pad layer, as those in a conventional parametric testline, pad 1 through 10 are address pads 110A connected to a multiplexing circuit, namely an address decoder, wherein pads 1 through 4, namely address pads AX1, AX2, AX3, AX4 connect to a row decoder (X-decoder) 120A via four row address latches 115A and pads 5 through 10, namely address pads AY1, AY2, AY3, AY4, AY5, AY6 connect to a column decoder (Y-decoder) 120B via six column address latches 115B, as illustrated in FIG. 2. Each testline includes a clock pad CLK, which is connected to a clock source and generates a clock signal of 1 MHz. Address input signals AX1~AX4 and AY1~AY6 are sampled and latched into the row and column address latches 115A, 115B on the positive edge of said clock signal and are then sent to X-decoder 120A and Y-decoder 120B, respectively. The latched input signals are shown as DX1~DX4 and DY1~DY6 in FIG. 2. DX1~DX4 are inputs to X-decoder and DY1~DY6 are inputs to Y-decoder. Pads VDD and VSS on a MUX testline connect to a power/ground source on a tester via test probes and supplies DC power and a ground path to the address latches, address decoding circuits. In preferred embodiments, a DC voltage of 1.8V, 2.5V, 3.3V and 5V can be provided by a tester to power testlines made by different technology generations.

Figure 3:
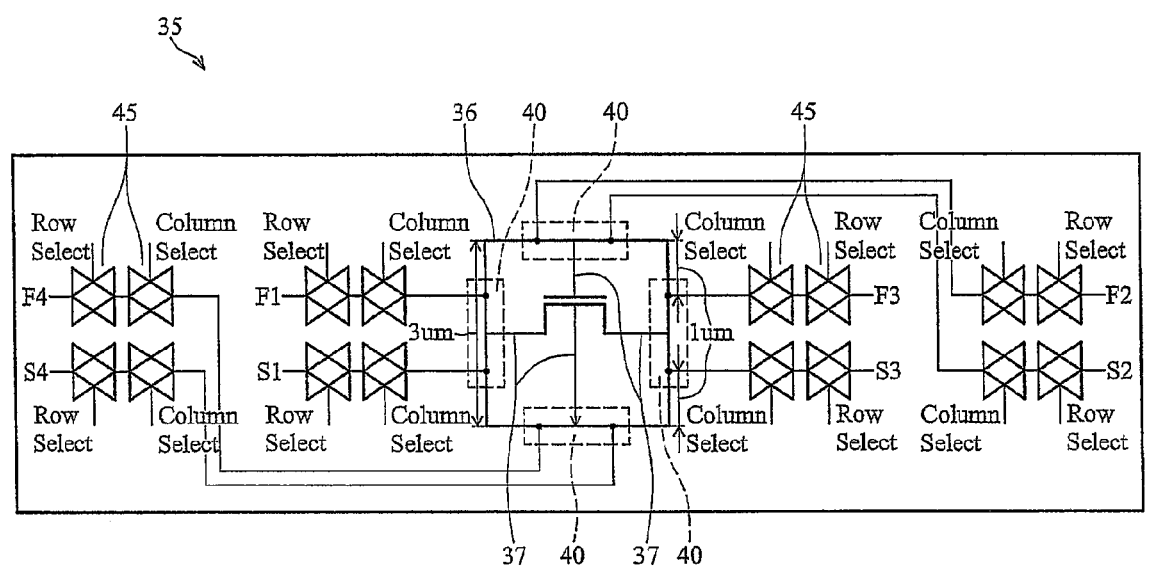
FIG. 3 is a schematic view of a test device unit cell.
Figure 4:
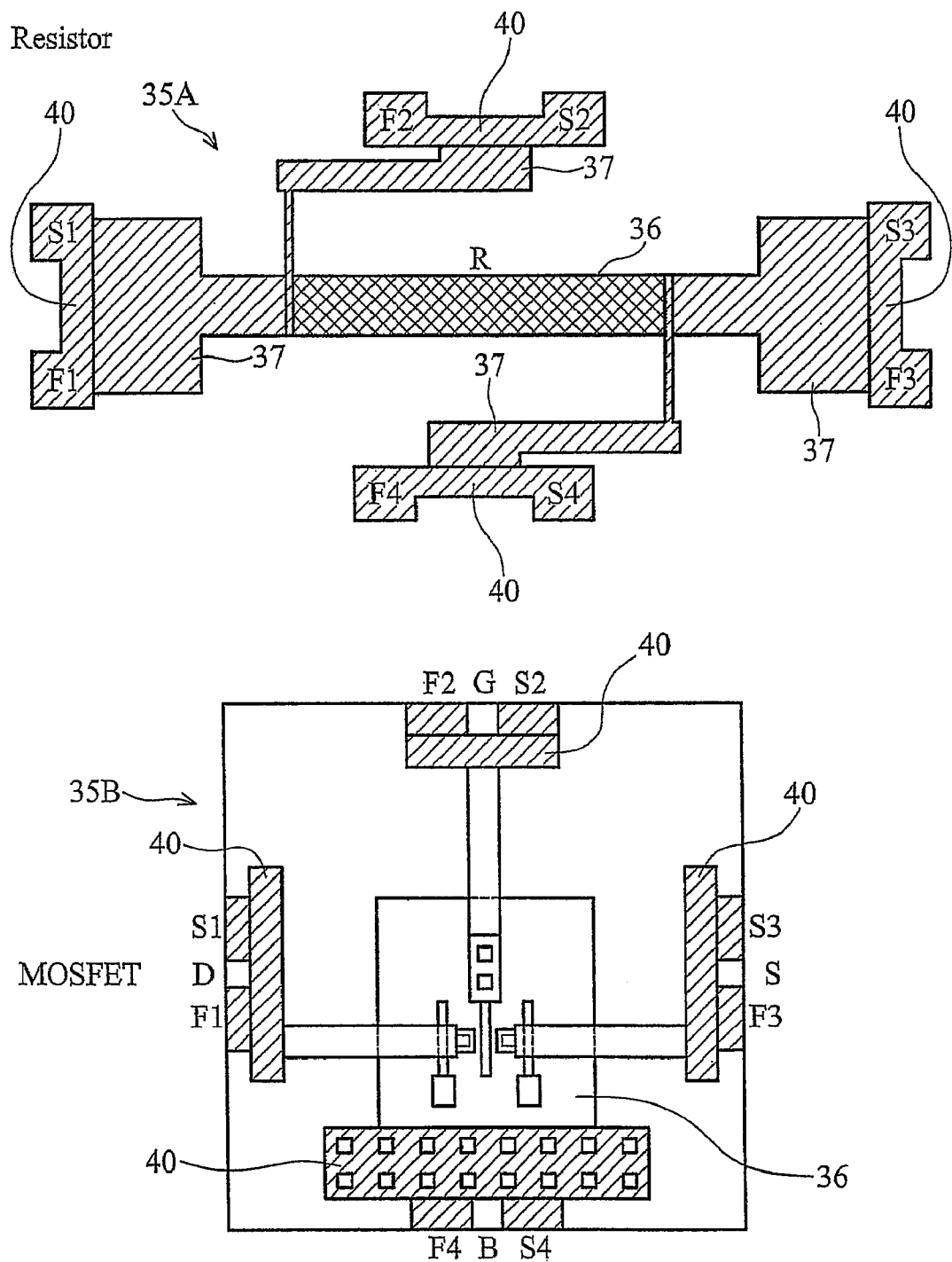
FIG. 4 is the layout view of two exemplary test devices.

FIG. 3 is a schematic view of a DUT unit cell 35 on a MUX testline in preferred embodiments. The DUT unit cell comprises a DUT 36 located at the center, four terminals 37 and sensing/forcing structures 40 attaching to each terminal. FIG. 4 shows the layout view of two exemplary DUT unit cells 35A, 35B. The DUT may be selected from a group consisting of MOS devices, field MOS devices, diode devices, capacitor dielectric film devices, resistor devices, contact/via chain devices, gate/field dielectric integrity devices, reliability devices, memory devices, and user designed, application-specific circuit structures, although other test devices are still within the contemplated scope of this invention. A sensing/forcing structure 40 may be made from metal or other electrically conductive materials. Referring to FIG. 3, each of the sensing/forcing structures 40 is connected between a pair of sensing/forcing test pads 110B on a MUX testline and one of the DUT terminals 37 through a plurality of transmission switches (MOS devices) 45 in the address decoder circuits. When address input signals are applied on the address pads AX1~AX4, AY1~AY6 110A of a MUX testline and sampled into the address latches by the clock signal, transmission switches 45 in the row decoder 120A select one row out of $2^4$ row addresses, and transmission switches 45 in the column decoder 120B select one column out of $2^6$ column addresses. Hence, a DUT unit cell corresponding to the selected row and column is uniquely selected out of $2^4 \times 2^6$ available DUT cells, and the DUT terminals are electrically connected to test pads 110B (F1/S1~F4/S4) on a MUX testline through the transmission switches 45. This enables one of a plurality of test devices to be evaluated by applying stimulus to and receiving responses back from a selected DUT unit cell 35 via test pads 110B on a MUX testline. By sequentially applying different predetermined addresses to the address decoder, all the test devices can be sequentially connected to the tester so that parametric test can be individually carried out. The details concerning testing a selected device will be illustrated in the following.

It should be understood that there exists many means for selecting one device out of a device array by a selecting circuit. The address decoder circuits illustrated in the preferred embodiments are disclosed to convey the concept of the present invention to those skilled in the art. It should not be construed as being limited to the embodiments set forth herein.

In one embodiment, the size of each DUT unit cell of FIG. 3 is 5 um by 41.5 um, while it is 30 um by 15 um, in another embodiment. As recognized by those skilled in the art, the size of a DUT unit cell may be reconfigurable to accommodate DUTs of different sizes and does not impose limitations on the invention, so long as design rules are honored. In preferred embodiments, the address decoder circuits and the DUT unit cells are formed under the MUX testline pad layer and stacked on the surface of the substrate. This arrangement offers significant advantages on testline space utilization.

As discussed above, when a DUT unit cell is selected, the DUT terminals are electrically connected to pads F1/S1~F4/S4 on a MUX testline. Test stimuli stored in a tester may be sent into the selected DUT and responses be retrieved back via the F1/S1~F4/S4 pads. However, as recognized by those skilled in the art, the testline structures formed in accordance with embodiments of the present invention present high resistances between the probe tips and the DUT terminals, due to the long conductive paths through address latches and address decoder circuits as illustrated in FIG. 2. This causes an IR drop effect along the test signal paths. The effect escalates in advanced technology of smaller feature size and negatively impacts the accuracy of the test results. A solution to this issue leads to the second aspect of the present invention.

Figure 5:
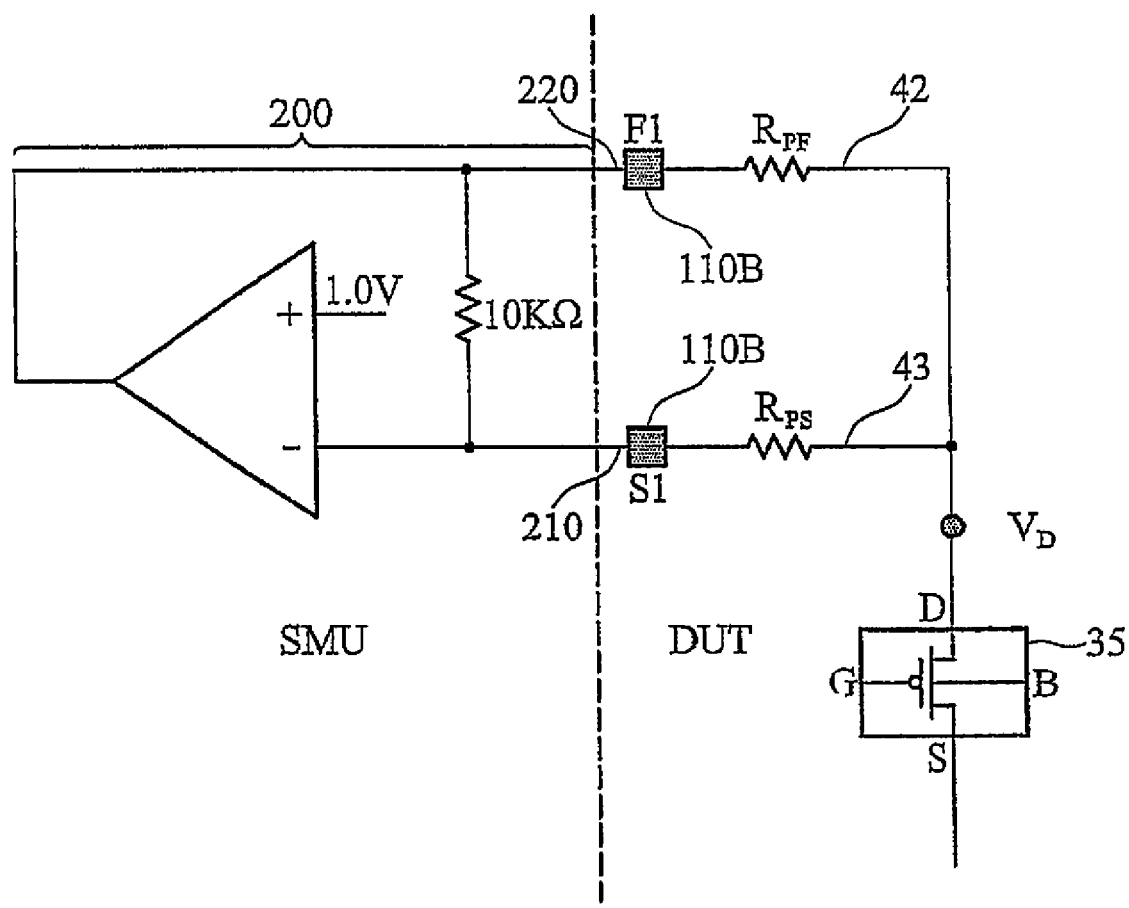
FIG. 5 illustrates the configuration for making Kelvin connections to a test device terminal.

The second aspect of this invention relates to probe card and tester configurations for IR drop compensation in accordance with preferred embodiments. FIG. 5 illustrates the configuration for performing wafer acceptance testing (WAT) in preferred embodiments, which includes a source measurement unit (SMU) 200 on a testing apparatus, test signal pads 110B, test signal paths 42, and DUT unit cell 35. This configuration makes use of the well-known Kelvin connection used to offset IR drop in an electrical circuit and provides a solution to minimize the IR drop effect in a semiconductor device. As an example to explain the testing method, the DUT is a MOSFET, and a first forcing test pad F1 and a first sensing test pad S1 on the MUX testline are commonly connected to a drain terminal "D" of the MOSFET when it is selected by address decoder circuit, as explained earlier. The first forcing pad F1 is connected externally to a testing apparatus which provides a stimulation signal to the MOSFET and the first sensing pad S1 is connected externally to the testing apparatus which receives a response signal from the selected MOSFET. In preferred embodiments, F1 and S1 connect to an SMU 200 of a testing apparatus. An SMU is an instrument capable of sourcing and measuring voltage and current simultaneously and is widely used in semiconductor device parametric measurements. The preferred embodiments use an SMU to generate test signals and retrieve test results. To insure a pre-selected voltage is applied at terminal "D," shown in FIG. 5, in order for conducting accurate measurements on the MOSFET, the voltage at terminal "D" is constantly sensed by a sensing probe 210 contacting S1. As recognized by those skilled in the art, the electrical current on the sensing path 43 is negligibly small due to the extremely high input impedance on the sensing probe S1, which connects to the input terminal of an OP-AMP of the SMU. Hence, the voltage value sensed on S1 is very nearly the same as the voltage at terminal "D" of the DUT. A feedback loop in the SMU 200 reads the sensed voltage value on S1 and adjusts the supply voltage on F1 via forcing probe 220 until a pre-selected voltage at terminal "D" is sensed. Kelvin connections to other DUT terminals can be made by the same method. In preferred embodiments, the OP-AMP could be on the probe card or in the tester.

As recognized by those skilled in the art, although parametric test using an SMU is common practice within the semiconductor industry, the present invention makes use of a built-in feedback loop circuit in an SMU to carry out "sense" and "force" operations on MUX testline pads in order to make Kelvin connections to DUT terminals, which compensates IR drops in address decoder circuits, probe needles and probe cards. This, in turn, will render highly accurate parametric measurements without increasing costs on the test apparatus.

It should be noticed that the Kelvin technique requires each of the forcing and sensing probes be insulated from each other. In preferred embodiments, forcing and sensing probes are covered with insulating coating and electrically isolated from each other by a large resistance of about 10 KΩ in the OP-AMP of the SMU, although other insulating means are not excluded.

Figure 6A:
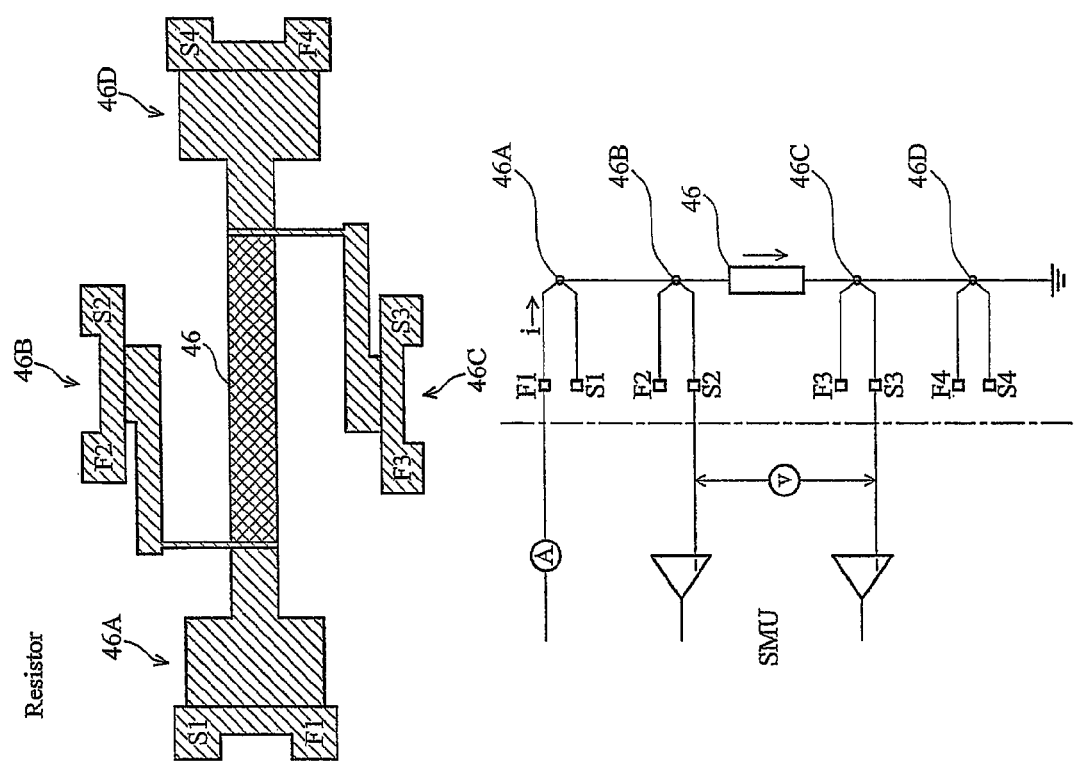
FIG. 6A illustrates the configuration for performing Kelvin measurements on a resistor.

When Kelvin connections are made to DUT terminals, parametric tests may be conducted. In preferred embodiments, each DUT has four terminals in order to facilitate a Kelvin measurement of high accuracy, as appreciated by those skilled in the art. As an example in preferred embodiments, FIG. 6A is a schematic diagram showing a Kelvin configuration used to accurately measure the resistance of a resistor. A strip resistor 46 under test contains four terminals. Force pad F1 supplies a constant current on a terminal structure 46A from a current source in the SMU. Sense pads S2, S3 connect to terminal structure 46B and 46C individually for measuring the voltage across the strip resistor 46. Terminal 46D is a common ground. When strip resistor 46 is selected by the address decoder of the MUX testline, its resistance is obtained as a quotient of the measured voltage and the supplied current.

Figure 6B:
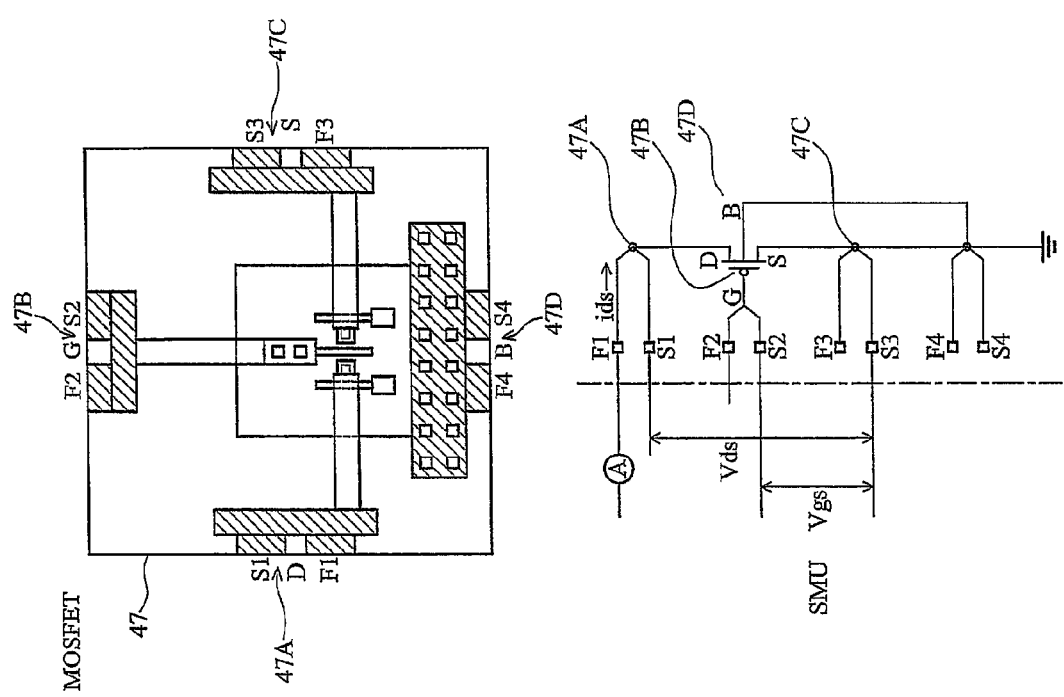
FIG. 6B illustrates the configuration for performing Kelvin measurements on a MOSFET.

FIG. 6B is a schematic diagram showing a Kelvin configuration used to accurately measure the current-voltage characteristics of a MOSFET. The MOS transistor 47 under test contains four terminals. Force pad F1 supplies a voltage on drain terminal 47A from a voltage source in the SMU. Force pad F2 supplies a voltage on gate terminal structure 47B from a voltage source in the SMU. Source terminal 47C and bulk 47D are common ground. By sensing and forcing voltages on terminals 47A, 47B and 47C, pre-selected gate-to-source voltage Vgs and drain-to-source voltage Vds can be set on respective terminals and drain current Ids can be measured with high accuracy.

As will be appreciated by those skilled in the art, in both examples, accurate sensing and forcing a pre-selected voltage on a test device terminal is critical to the accuracy of test results, hence the sensing and forcing contact on a sensing/forcing structure (46x, 47x, in above examples) are preferably at the closest proximity to the terminal, whereas the layout shape of a sensing/forcing structure is less critical, so long as the shape of the sensing/forcing structure does not create significant parasitic effects.

Figure 7:
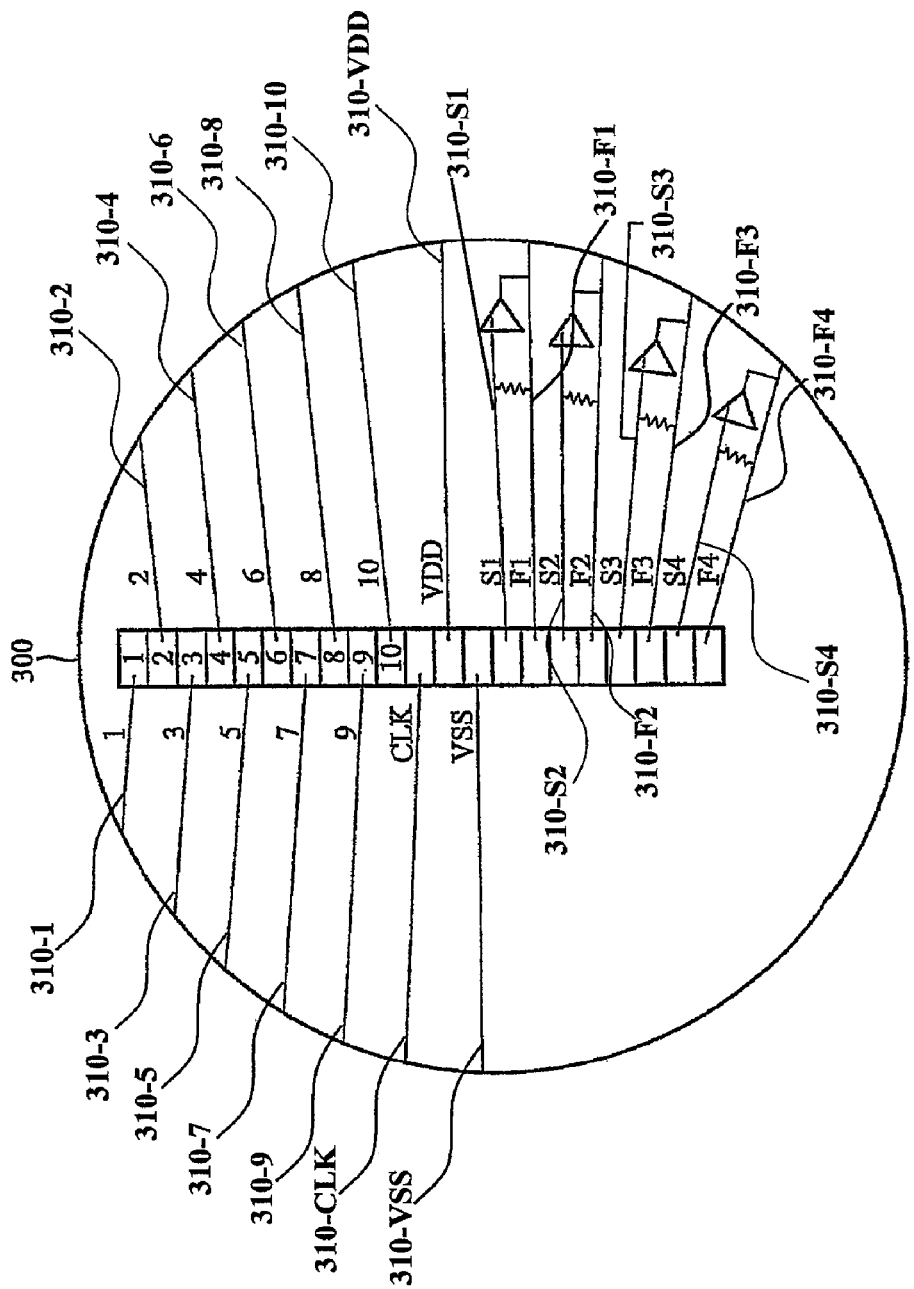
FIG. 7 illustrates an exemplary probe card configuration for IR compensation.

FIG. 7 shows a plan view of a probe card configuration used in a MUX testline measurement in the preferred embodiments. A probe card comprises a probe substrate 300 such as a circuit board and a plurality of probe pins 310 extending from a bottom surface of the probe substrate. The probe card is connected to a tester (not shown), where test stimuli are generated and test responses processed and stored. When conducting parametric measurement on a wafer substrate, the probe card is lowered from its rest position so that probe pins 310 make a solid contact to the MUX testline pads (shown as dashed squares). Then, a predetermined DUT address code stored in the tester is applied on the address pads—pad 1 through pad 10 in FIG. 7—through address probe pins—address probe pin 310-1 through address probe pin 310-10. A clock signal generated in the tester is applied on pad CLK through clock probe pin 310-CLK, and the address signals are sampled on the positive clock edge and latched into the address decoder circuits, which are powered by the DC voltage source from pads VDD and VSS through power probe pin 310-VDD and ground probe pin 310-VSS, respectively. The address decoder reads the address code and selects a DUT from a test device array formed under the testline corresponding to the address. The pre-programmed test stimuli are then applied on the selected test device and responses on the test device are retrieved back to the tester through test pads F1/S1-F4/S4 shown in FIG. 7 through test probe pins 310-F1, 310-S1, 310-F2, 310-S2, etc. This further comprises the steps of reading a predetermined test condition (voltages on DUT terminals) from the tester, sensing the voltages on a DUT terminals, forcing the predetermined test conditions on the DUT terminals, applying stimuli on forcing pads and retrieving responses from sensing pads, reading a predetermined test condition for the next test parameter, sensing the voltages on a DUT terminals, forcing the predetermined test conditions on the DUT terminals, applying stimuli and retrieving responses, and so on. By sequentially applying different predetermined addresses to a MUX testline, all DUTs can be tested by predetermined test stimuli.

Figure 8:
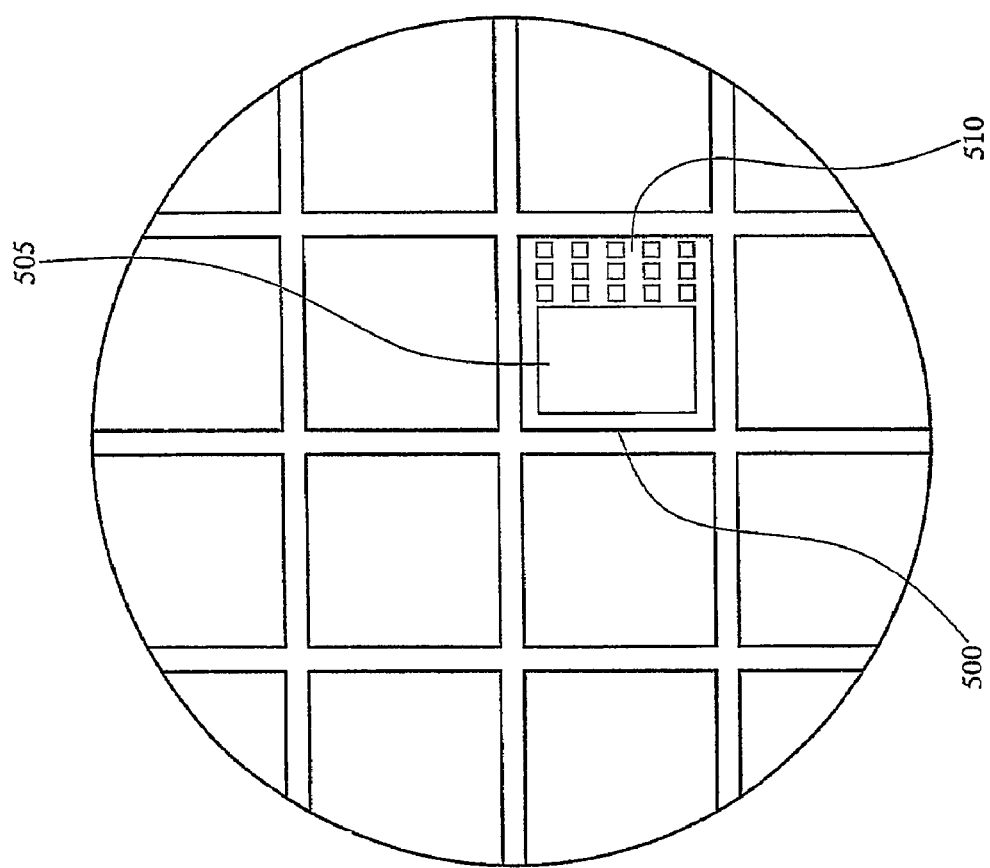
FIG. 8 is a plan view of a MUX testline formed in an integrated circuit die area on a semiconductor wafer substrate.

FIG. 8 illustrates an alternate embodiment of the present invention, where testline structures are formed in the chip die area and may be used for parametric, reliability, and functional tests. As an example, an integrated circuit die area 500 allocated to a circuit designer/customer on a foundry shuttle wafer includes a prototype circuit product 505 and testline structure 510 arranged along one edge of the die. The testline structure 510 comprises an array of test pads, an address decoder under the test pads layer and a large number of test devices formed under the test pads area. Each of the steps in selecting a test device and making a Kelvin measurement on the test device in the first embodiment can be performed in the alternate embodiment. In this embodiment, circuit designers/customers can integrate a large number of product specific/critical test structures on the foundry shuttle wafers for process sensibility, DFM evaluation early in the product development stage.

Although the present invention and its advantages have been described in detail, it should be understood that various changes, substitutions and alterations can be made herein without departing from the spirit and scope of the invention as defined by the appended claims. For example, each DUT terminal can connect to more than one sensing and forcing pads for measurements with even higher accuracy. As another example, it will be readily understood by those skilled in the art that the total number of address pads may be varied for accessing even more DUTs while remaining in the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit testline structure comprising:
a substrate having a working top surface;
a plurality of test devices formed in said substrate;
a test pad layer comprising a plurality of testline pads which comprise:
   a first address pad to provide a first address code to a selection circuit;
   a second address pad to provide a second address code to said selection circuit;
   a first forcing pad to provide a first stimulus to a device terminal of at least one of said test devices;
   a first sensing pad to sense a first response from a device terminal of at least one of said test devices; and
said selection circuit configured to read said first and second address code, and selectively connect a first terminal of one of said test devices to said first sensing and said first forcing pads in response to said first and second address code, wherein said selection circuit and said plurality of test devices are under said test pad layer.

2. The testline structure in claim 1 wherein the said testline pads are formed in a scribe line area.

3. The testline structure in claim 1, wherein the test devices are each selected from a group consisting of MOS devices, field MOS devices, diode devices, capacitor dielectric film devices, resistor devices, contact/via chain devices, gate/field dielectric integrity devices, reliability devices, and memory devices.

4. The testline structure in claim 1, wherein each of the test devices comprises:
a DUT with at least four terminals and sensing/forcing structures attaching to each terminal.

5. The testline structure in claim 1 further comprises:

a first power pad, a first ground pad and a first clock pad to provide power supply and clock signal to said selection circuit.

6. The testline structure in claim 1, wherein the selection circuit comprises:
   a plurality of transmission switches, so that each of said transmission switches being connected between a terminal of one of said test devices and said first sensing or said first forcing pad; and
   an address decoder circuit in communication with each of said transmission switches to selectively connect a first terminal of one of said test devices to said first sensing and said first forcing pad.

7. The testline structure in claim 1 wherein said testline pads are formed in an integrated circuit die area on said substrate.

8. An semiconductor device testline structure comprising:
   a support substrate;
   a plurality of test devices formed in said substrate;
   a test pad layer comprising a plurality of testline pads formed on the surface of said substrate which comprise:
      a first address pad to provide a first address code to a selection circuit;
      a second address pad to provide a second address code to said selection circuit;
      a first forcing pad to provide a first stimulus to a device terminal of at least one of said test devices;
      a first sensing pad to sense a first response from a device terminal of at least one of said test devices;
      a second forcing pad to provide a second stimulus to a device terminal of at least one of said test devices;
      a second sensing pad to sense a second response from a device terminal of at least one of said test devices; and
   said selection circuit configured to read said first and second address code, and selectively connect a first terminal of one of the test devices to said first sensing and said first forcing pads and connect a second terminal of one of said test devices to said second sensing and said second forcing pads in response to said first and second address code, wherein said selection circuit and said plurality of test devices are under said test pad layer.

9. The testline structure in claim 8 wherein said substrate is made from semiconductor materials comprising:
   silicon, silicon germanium, gallium arsenide, or indium phosphide.

10. The testline structure in claim 8 wherein said testline pads are formed in a scribe line area on said substrate.

11. The testline structure in claim 8, wherein the test devices are each selected from a group consisting of MOS devices, field MOS devices, diode devices, capacitor dielectric film devices, resistor devices, contact/via chain devices, gate/field dielectric integrity devices, reliability devices, and memory devices.

12. The testline structure in claim 8 wherein said testline pads are formed in an integrated circuit die area on said substrate.

13. The testline structure in claim 8, wherein the selection circuit comprises:
   a plurality of transmission switches, so that each of said transmission switches being connected between a terminal of one of said test devices and said first sensing or said first forcing pad; and
   an address decoder circuit in communication with each of said transmission switches to selectively connect a first terminal of one of said test devices to said first sensing and said first forcing pads, and connect a second terminal to said second sensing and said second forcing pads.

14. A method of testing an integrated circuit comprising:
   applying a first address code to a first address pad;
   applying a second address code to a second address pad;
   in response to applying the first and second address codes to the first and second address pads, respectively, selectively coupling at least one test device, from among a plurality of test devices, to a first sensing pad and a first forcing pad;
   applying a stimulus to at least one said test device via said first forcing pad; and
   detecting a response of at least one said test device via said first sensing pad.

15. The method of claim 14 further comprises the step of:
   applying a feedback loop circuit to sense a voltage at a test device terminal via said first sensing pad and force a pre-selected voltage on the test device terminal via said first forcing pad.

16. The method of claim 15 wherein said feedback loop circuit is a Source Measurement Unit (SMU) in an integrated circuit tester.

17. The method of claim 14 wherein applying said first and said second address codes, applying said stimulus and detecting said response is conducted through a probe card, which comprises:
   a first address probe; a second address probe; a first forcing probe; a first sensing probe; a second forcing probe; and a second sensing probe.

18. The method of claim 17, wherein the probe card further comprises:
   a first power probe, a first ground probe and a first clock probe to provide power supply and clock signal to the said testline structure.

* * * * *